US011482454B2

(12) United States Patent
Sun et al.

(10) Patent No.: US 11,482,454 B2
(45) Date of Patent: Oct. 25, 2022

(54) METHODS FOR FORMING SELF-ALIGNED CONTACTS USING SPIN-ON SILICON CARBIDE

(71) Applicant: Tokyo Electron Limited, Tokyo (JP)

(72) Inventors: Junling Sun, Albany, NY (US); Lior Huli, Albany, NY (US); Andrew Metz, Albany, NY (US); Angelique Raley, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 71 days.

(21) Appl. No.: 17/177,379

(22) Filed: Feb. 17, 2021

(65) Prior Publication Data

US 2022/0262679 A1 Aug. 18, 2022

(51) Int. Cl.
*H01L 21/768* (2006.01)
*H01L 21/3105* (2006.01)
*H01L 21/311* (2006.01)

(52) U.S. Cl.
CPC .. *H01L 21/76897* (2013.01); *H01L 21/31051* (2013.01); *H01L 21/31116* (2013.01); *H01L 21/76832* (2013.01)

(58) Field of Classification Search
CPC ......... H01L 21/76897; H01L 21/31051; H01L 21/31116; H01L 21/76832
See application file for complete search history.

(56) References Cited

U.S. PATENT DOCUMENTS

| 9,153,483 | B2 * | 10/2015 | Shieh | H01L 21/28141 |
| 9,245,894 | B2 | 1/2016 | Lytle | |
| 9,780,199 | B2 * | 10/2017 | Hung | H01L 29/66795 |
| 10,460,993 | B2 | 10/2019 | Ghani et al. | |
| 10,553,532 | B2 | 2/2020 | Schenker et al. | |
| 10,593,594 | B2 | 3/2020 | Lin et al. | |
| 2020/0066629 | A1 | 2/2020 | Schenker et al. | |
| 2020/0105876 | A1 * | 4/2020 | Ting | H01L 29/7848 |

* cited by examiner

*Primary Examiner* — Dale E Page
*Assistant Examiner* — Quovaunda Jefferson
(74) *Attorney, Agent, or Firm* — Slater Matsil, LLP

(57) ABSTRACT

Methods and improved process flows are provided herein for forming self-aligned contacts using spin-on silicon carbide (SiC). More specifically, the disclosed methods and process flows form self-aligned contacts by using spin-on SiC as a cap layer for at least one other structure, instead of depositing a SiC layer via plasma vapor deposition (PVD), chemical vapor deposition (CVD), atomic layer deposition (ALD), etc. The other structure may be a source and drain contact made through the use of a trench conductor. By utilizing spin-on SiC as a cap layer material, the disclosed methods and process flows avoid problems that typically occur when SiC is deposited, for example by CVD, and subsequently planarized. As such, the disclosed methods and process flows improve upon conventional methods and process flows for forming self-aligned contacts by reducing defectivity and improving yield.

20 Claims, 8 Drawing Sheets

| Chemistry Film | $Cl_2/O_2$ | | $CH_3F/H_2/Ar$ | |
|---|---|---|---|---|
| | ER(nm/min) | SiC/SiN | ER(nm/min) | SiN/SiC |
| SiN | 3.1 | – | 15.9 | – |
| SiC_1 | 70.5 | 22 | 4.04 | 3.9 |
| SiC_2 | 117.6 | 37.9 | 2.09 | 7.6 |
| SiC_3 | 374.3 | 120 | 1.8 | 8.8 |

FIG. 5

METHODS FOR FORMING SELF-ALIGNED CONTACTS USING SPIN-ON SILICON CARBIDE

BACKGROUND

The present disclosure relates to the processing of substrates. In particular, it provides a method of etching self-aligned contacts on substrates.

Substrate processing typically involves a series of manufacturing techniques related to the formation, patterning and removal of a number of layers of material on a substrate. As device linewidths continue to shrink, various individual processing steps require associated improvements. For example, as device sizes shrink, layer thicknesses shrink, and aspect ratios increase, the etch selectivity between one layer and another layer may need to increase accordingly. At times, as device criteria continue to shrink, improvements to an individual processing step may not be sufficient to meet the desired device criteria. Thus, the integration of the overall process flow of the individual process steps also may be modified to provide a repeatable, stable process flow which satisfies shrinking device criteria.

One process integration technique utilized to satisfy demanding design criteria is the formation of self-aligned structures. The use of such self-aligned structures allows the formation of structures that may be smaller than the normal lithography or etch tolerances and allows tighter layer-to-layer alignment tolerances. Thus, as is known in the art, a variety of self-aligned techniques may be utilized to form structures.

One exemplary self-aligned structure is a self-aligned contact. Self-aligned contacts may be utilized at a variety of points in a process integration flow. For example, self-aligned contacts have been known to be used for the formation of contacts to the gates of a semiconductor transistor. Self-aligned contacts may also be utilized for the formation of contacts to the source and drain regions of a transistor. Other self-aligned structures are known and it will be recognized that the structures described above are merely exemplary.

When forming self-aligned contacts to a transistor gate, differing cap materials are typically provided on the tops of the transistor gates and other structures (such as, for example, on top of conductors that are used for trench and source and drain regions). The differing cap materials provide different etch characteristics, so that the etch of the gate contact is selective to the other structures, and vice-versa. The other structures may include conductors at trench and source/drain regions. One known cap material utilized for on the conductors in source and drain contact regions is a chemical vapor deposition (CVD) silicon carbide (SiC) material. When CVD SiC is used as the cap material for source and drain contacts, silicon nitride (SiN) may be used as the gate cap.

As tolerances and thicknesses become more demanding, processes that use CVD SiC as a cap material for trench contacts have become unsatisfactory for self-aligned contacts. For example, the contact filling property of CVD SiC is not ideal and often leads to void formation. In addition, the planarization process (e.g., chemical mechanical polishing, (CMP)) used to remove excess CVD SiC to form caps for trench contacts is difficult, and often leads to further defects.

It would be desirable to provide an improved self-aligned gate contact process flow.

SUMMARY

Methods and improved process flows are provided herein for forming self-aligned contacts using spin-on silicon carbide (SiC). More specifically, the disclosed methods and process flows form self-aligned contacts by using spin-on SiC as a cap layer for at least one other structure, instead of depositing a SiC layer via plasma vapor deposition (PVD), chemical vapor deposition (CVD), atomic layer deposition (ALD), etc. The other structure may be a conductor to which a source and drain contact is made. By utilizing spin-on SiC as a cap layer material, the disclosed methods and process flows avoid problems that typically occur when SiC is deposited, for example by CVD, and subsequently planarized. As such, the disclosed methods and process flows improve upon conventional methods and process flows for forming self-aligned contacts by reducing defectivity and improving yield.

In a first embodiment, a method to form self-aligned contacts on a substrate is provided, the method comprising providing a plurality of first conductors on the substrate, providing a plurality of second conductors on the substrate and providing a first cap layer over the plurality of first conductors, the first cap layer comprising a first dielectric material. The method further comprises forming a second cap layer over the plurality of second conductors, wherein the second cap layer is formed by spin coating a second dielectric material onto the substrate, wherein the second dielectric material differs from the first dielectric material, and wherein the second dielectric material comprises silicon carbide (SiC). The method also comprises forming a dielectric layer on the substrate, such that the dielectric layer is formed on the first cap layer and the second cap layer. The method further comprises utilizing a first etch process to etch portions of the dielectric layer and the first cap layer according to a first masking pattern formed above the dielectric layer to form a plurality of first self-aligned contacts to the first conductors. The method also comprises utilizing a second etch process to etch portions of the dielectric layer and the second cap layer according to a second masking pattern formed above the dielectric layer to form a plurality second self-aligned contacts to the second conductors. According to the method, the second cap layer prevents exposure of the second conductors during the first etch process and the first cap layer prevents exposure of the first conductors during the second etch process.

Various embodiments of the first embodiment described herein are provided. In one embodiment, the first dielectric material comprises silicon nitride (SiN). In another embodiment, after the second cap layer is formed, the method further comprises planarizing the second cap layer to remove excess portions of the second cap layer and form a plurality of second dielectric caps on the plurality of second conductors. In another embodiment, the method further comprises providing recesses above the plurality of second conductors, wherein the spin coating of the second dielectric material onto substrate fills the recesses with the second dielectric material. In other embodiments, the method prevents void formation in the plurality of second dielectric caps by spinning the second dielectric material onto the substrate. In yet another embodiment, by spinning the second dielectric material onto the substrate, the method reduces or eliminates defects that occur in the plurality of second dielectric caps that occur when planarizing the second cap layer. In still another embodiment, the first etch process has a higher etch rate of the first dielectric material than of the silicon carbide and the second etch process has a higher etch rate of the silicon carbide than of the first dielectric material.

In a second embodiment, a method for processing a substrate to form self-aligned contacts to conductors of a semiconductor transistor, the method comprising providing a gate conductor of the semiconductor transistor on the substrate, providing a first dielectric cap on the gate conductor, the first dielectric cap comprising a first dielectric material, and providing trench conductors on either side of the gate conductor, wherein the trench conductors are in contact with source and drain regions of the transistor. The method further comprises forming second dielectric caps over the trench conductors by spin coating a film comprising a second dielectric material onto the substrate, wherein the second dielectric material differs from the first dielectric material, and wherein the second dielectric material comprises silicon carbide (SiC). The method also comprises depositing a dielectric layer onto the semiconductor transistor, such that the dielectric layer is deposited over the first dielectric cap and the second dielectric caps. The method further comprises etching portions of the dielectric layer and the first dielectric cap to form a self-aligned gate contact to the gate conductor. The method also comprises etching portions of the dielectric layer and the second dielectric caps to form self-aligned source and drain contacts to the trench conductors. According to the method, the second dielectric caps prevent exposure of the trench conductors while forming the self-aligned gate contact and the first dielectric cap prevents exposure of the gate conductor while forming the self-aligned source and drain contacts.

Various embodiments of the second embodiment described herein are provided. In one embodiment, the method further comprises providing recesses above the trench conductors, wherein the spin coating of the film comprising the second dielectric material onto the substrate fills the recesses with the film. In another embodiment of the method, after spin coating of the film, the method further comprises planarizing the film to remove excess portions of the film to leave the second dielectric caps over the trench conductors. In another embodiment, the method includes a first etch process utilized to etch the self-aligned gate contact has a higher etch rate of the first dielectric material than of the silicon carbide and a second etch process utilized to etch the self-aligned source and drain contacts has a higher etch rate of the silicon carbide than of the first dielectric material. Some embodiments of the method, the second etch process comprises a chlorine-based plasma etch chemistry. In one embodiment of the method. the second etch process comprises a chlorine-oxygen ($Cl_2/O_2$) plasma etch chemistry. In some embodiments of the method, the first etch process comprises fluoromethane based plasma etch chemistry. In some embodiments of the method, the first etch process comprises a fluoromethane-hydrogen-argon ($CH_3F/H_2/Ar$) plasma etch chemistry. In one embodiment of the method, the first dielectric material comprises silicon nitride, and the etching portions of the dielectric layer and the first dielectric cap to form the self-aligned gate contact to the gate conductor comprises utilizing a fluoromethane based plasma etch chemistry.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

FIG. 5 is a table comparing the etch rate and etch selectivity between different spin-on silicon carbide (SiC) films and an example silicon nitride (SiN) film.

DETAILED DESCRIPTION

Methods and improved process flows are provided herein for forming self-aligned contacts using spin-on silicon carbide (SiC). More specifically, the disclosed methods and process flows form self-aligned contacts by using spin-on SiC as a cap layer for at least one other structure, instead of depositing a SiC layer via plasma vapor deposition (PVD), chemical vapor deposition (CVD), atomic layer deposition (ALD), etc. The other structure may be a source and drain contact made through the use of a trench conductor. By utilizing spin-on SiC as a cap layer material, the disclosed methods and process flows reduces or eliminates problems that typically occur when SiC is deposited, for example by CVD, and subsequently planarized. As such, the disclosed methods and process flows improve upon conventional methods and process flows for forming self-aligned contacts by reducing defectivity and improving yield.

Figure 1:
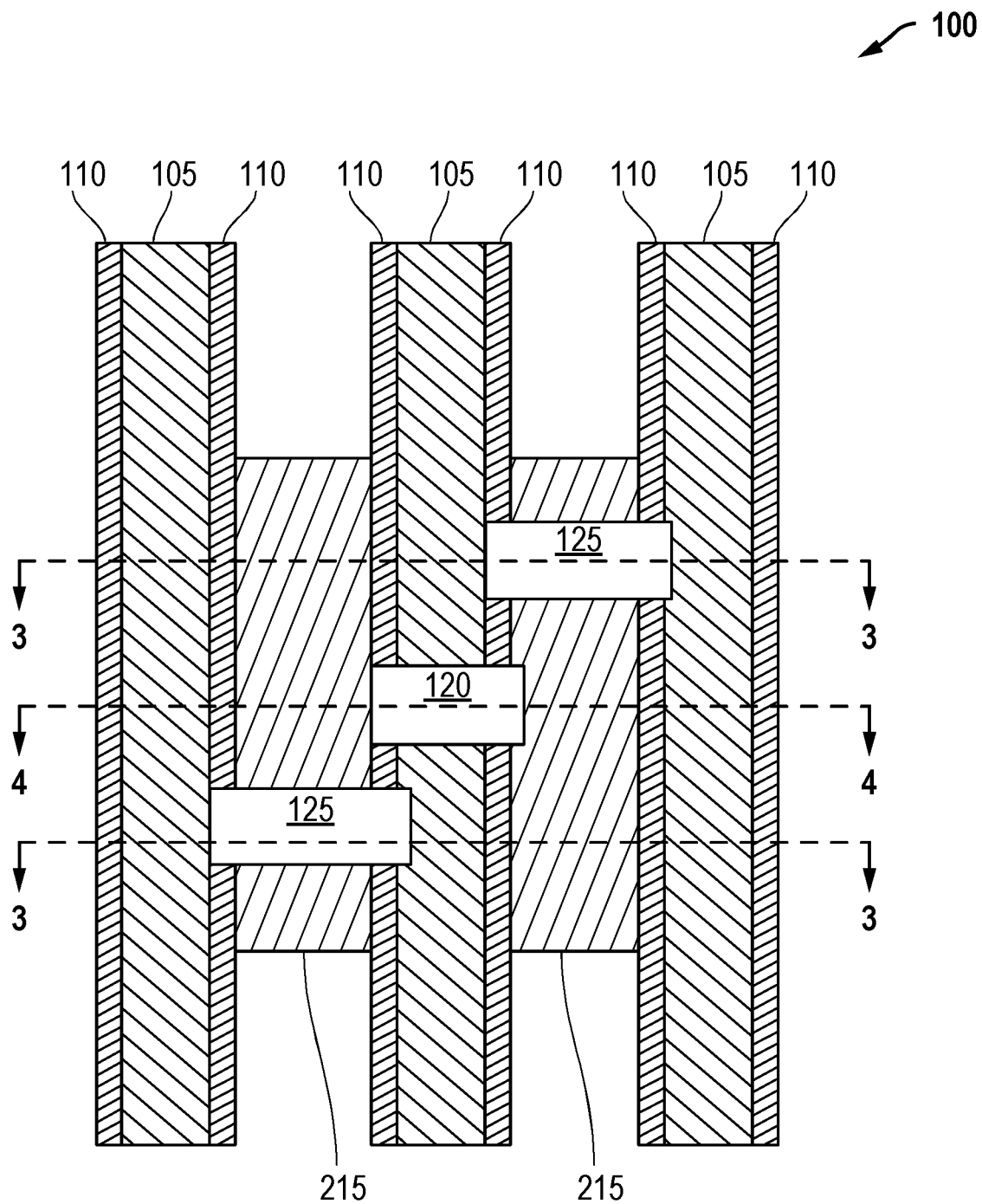
FIG. 1 is a top-down view of a semiconductor structure (e.g., a transistor) comprising self-aligned contacts formed in accordance with the methods and improved process flows described herein.

The techniques described herein to form self-aligned contacts using a spin-on SiC cap layer may be utilized with a wide range of semiconductor structures and process flows. In the example embodiments provided herein, the disclosed techniques are used to form self-aligned contacts for a semiconductor transistor. One example of a semiconductor transistor (e.g., a metal-oxide-semiconductor field-effect transistor, or MOSFET) having gate, source and drain contacts is shown in FIG. 1. One example of an improved process flow for forming self-aligned contacts (e.g., self-aligned gate, source and drain contacts) for a semiconductor transistor is shown in FIGS. 2A-2H. It will be recognized, however, that the semiconductor structures and process flows shown herein are merely exemplary and those skilled in the art will recognize many other alternatives that may obtain the advantages of the techniques described herein. In some embodiments, the improved process flow shown in FIGS. 2A-2H and described herein may be used to form self-aligned contacts for other types of semiconductor transistors. In other embodiments, similar process flows may be used to form self-aligned contacts for other types of semiconductor structures.

Prior to performing the techniques described herein, one or more layers used to form the semiconductor structure may be provided on a substrate utilizing any of a wide variety of substrate processing techniques to achieve the structure shown. The substrates utilized with the techniques disclosed herein may be any substrates for which the depositing, planarizing and etching of material is desirable. For example, in one embodiment, the substrate may be a semiconductor substrate having one or more semiconductor processing layers (all of which together may comprise the substrate) formed thereon. In one embodiment, the substrate may be a substrate that has been subject to multiple semiconductor processing steps, which yield a wide variety of structures and layers, all of which are known in the substrate processing art. In one embodiment, the substrate may be a semiconductor wafer including various structures and layers formed on and/or within a base substrate.

FIG. 1 is a top-down view of a substrate having a semiconductor structure 100 including a plurality of self-aligned contacts formed in accordance with the techniques described herein. The semiconductor structure 100 shown in FIG. 1 is provided as one example of a semiconductor structure (e.g., a MOSFET transistor) having self-aligned contacts. It will be recognized that the semiconductor structure 100 and the various layers used to form the semiconductor structure 100 are merely exemplary. Thus, alternative layers and materials, and alternative process flows for forming such layers and materials, may be utilized while still obtaining the benefits of the techniques disclosed herein.

The semiconductor structure 100 shown in FIG. 1 is a semiconductor transistor (e.g., a MOSFET transistor) having a self-aligned gate contact 120 and self-aligned source and drain contacts 125. In the example embodiment shown in FIG. 1, transistor dimensions are reduced by forming each contact (i.e., gate contact 120 and source and drain contacts 125) in a different plane of the semiconductor structure 100. Thus, as shown in FIG. 1 each of the self-aligned gate contact 120 and the two self-aligned source drain contacts 125 are offset from each other. It will be recognized, however, that the techniques disclosed herein are not limited to the example embodiment shown in FIG. 1, and may also be used when two or more self-aligned contacts are formed within the same plane of the semiconductor structure 100.

Returning to FIG. 1, a self-aligned gate contact 120 is formed to an underlying transistor gate 105 having sidewall spacers 110. The transistor gate 105 is formed from a conductive material, such as for example, polysilicon or a silicide thereof, a metal material (including titanium, tantalum, hafnium, platinum, and aluminum) or a metal alloy, etc. Other materials used to form transistor gate 105 include, but are not limited to metal nitrides (including titanium nitride, tantalum nitride, and titanium aluminum nitride), metal oxides (including iridium oxide and ruthenium oxide), metal silicides (including titanium silicide, nickel silicide, and tungsten silicide). Sidewall spacers 110, on the other hand, are typically formed from a dielectric material, such as for example, an oxide (for example silicon oxide) or a low K dielectric material. Other example materials used to form sidewall spacers 110 include, but are not limited to, a wide range of materials, including boron carbon doped silicon nitride (SiBCN), carbon doped silicon nitride (SiCN), silicon nitride (SiN), or silicon oxynitride (SiON). Although examples are provided herein, it is recognized that the transistor gate 105 and the sidewall spacers 110 may be formed using any known materials and/or processes.

Self-aligned source and drain contacts 125 are formed on each side of the transistor gate 105 to underlying trench conductors 215, which in turn, are formed above source and drain regions of the subsequently formed semiconductor transistor. The trench conductors 215 are generally formed from a conductive material, such as a metal or metal alloy. Example materials used to form trench conductors 215 include, but are not limited to, tungsten (W), cobalt (Co) and ruthenium (Ru). Although examples are provided herein, it is recognized that the trench conductors 215 may be formed using any known conductive materials formed by a variety of known processes.

FIGS. 2A-2H illustrate one example of an improved process flow for forming self-aligned contacts for a semiconductor structure in accordance with the techniques described herein. More specifically, FIGS. 2A-2H illustrate an improved process flow for forming self-aligned gate, source and drain contacts for the exemplary transistor shown in FIG. 1. Although a process flow for a particular semiconductor structure (e.g., a MOSFET transistor) is shown in FIGS. 2A-2H, one skilled in the art would recognize how similar process flows may be used to form self-aligned contacts for other types of transistors and other types of semiconductor structures.

Figure 2A:
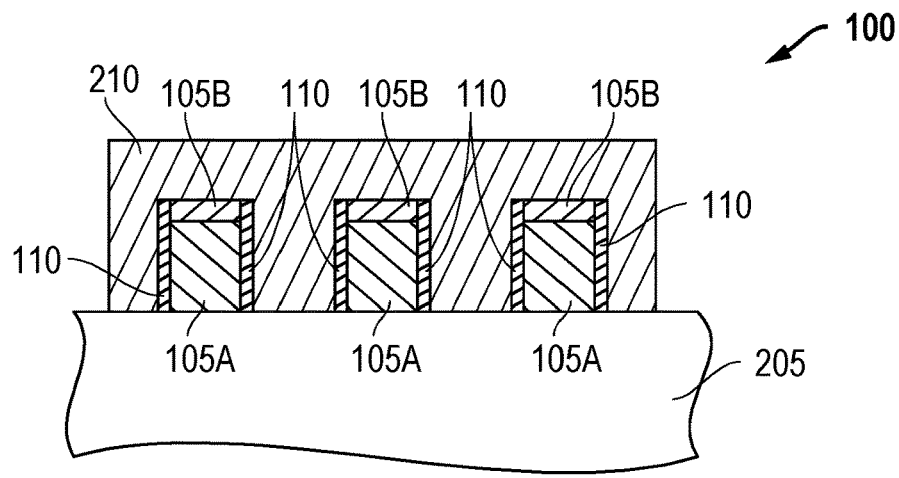
FIGS. 2A-2H are cross-sectional views illustrating one embodiment of an improved process flow for forming the self-aligned contacts shown in FIG. 1.

FIG. 2A is a cross-sectional view through the semiconductor structure 100 shown in FIG. 1 illustrating a plurality of gate conductors 105A formed above one or more underlying layers 205. Underlying layers 205 may include any number and/or type of layers and/or structures typically used to form a transistor. For example, the underlying layers 205 may generally include a substrate having one or more semiconductor processing layers formed thereon. Source/drain regions for a plurality of transistors may be formed within the substrate, and the gate conductors 105A shown in FIG. 2A may be formed on the substrate between respective source/drain regions. Underlying layers 205 may also include other layers, such as for example, gate oxide layers formed between the substrate and each of the gate conductors 105A.

As noted above and shown in FIG. 1, gate conductors material may be formed on the substrate a substrate as part of the semiconductor structure 100. Above the gate conductor material a gate top dielectric material may be formed. The gate conductor material and the gate top dielectric material may then be patterned to yield the gate conductors 105A and gate caps 105B as shown in FIG. 2A. Sidewall spacers 110 are formed along the sidewalls of each of the gate conductors 105A as shown in FIG. 2A. To form sidewall spacers 110 (see, FIG. 2A), a layer of dielectric material may be deposited onto the semiconductor structure 100 and etched using any of a wide variety of known spacer etch process. Example materials used to form the gate caps 105B include, but are not limited to, SiN, SiCN or carbon doped silicon oxide (SiCO).

A first dielectric layer 210 may be deposited onto the semiconductor structure 100 over the gate conductors 105A, gate caps 105B and sidewall spacers 110, as shown in FIG. 2A. The first dielectric layer 210 may be an oxide, such as for example, silicon dioxide ($SiO_2$), SiCO or other dielectrics. The first dielectric layer 210 may be deposited using any of a wide variety of known processes.

Figure 2B:
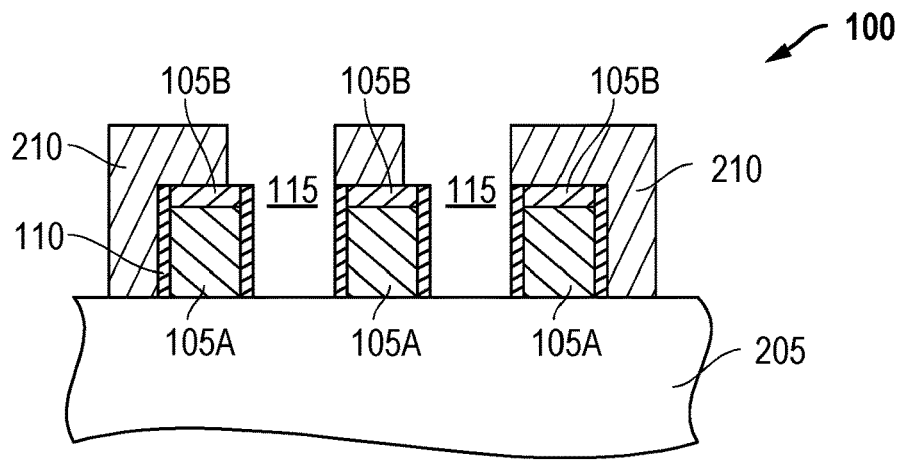

In FIG. 2B, the first dielectric layer 210 is etched to form trench contacts 115, which are self-aligned to the sidewall spacers 110 of the gate conductors 105A. The trench contacts 115 may be formed by providing a patterning layer (not shown) above the first dielectric layer 210 and etching portions of the dielectric layer exposed by the patterning layer to form the trench contacts. The trench contacts 115 may be etched using any of a wide variety of known etch processes. In one embodiment, the etch chemistry used to etch the trench contacts 115 may have a higher etch rate of the first dielectric layer 210 and lower etch rate of the material that forms the gate caps 105B (e.g., SiN), so that the gate caps 105B act as an etch stop layer during the trench contacts protecting the underlying gate conductors 105A.

Figure 2C:
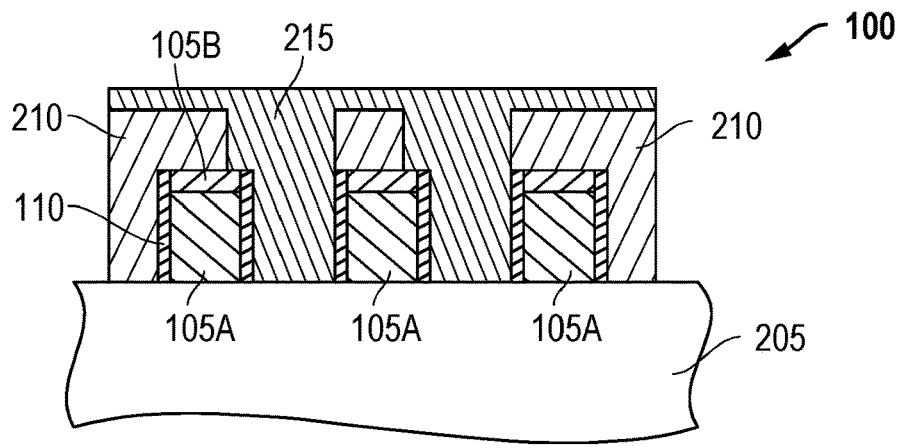

In FIG. 2C, a trench conductor material is deposited onto the semiconductor structure 100 so as to fill the trench contacts 115 with the trench conductors 215. In one embodiment, the trench conductors 215 material may be tungsten (W) or another conductive material commonly used to form trench conductors (e.g., cobalt or ruthenium). The trench conductors 215 material may be deposited using any of a wide variety of known processes.

Figure 2D:
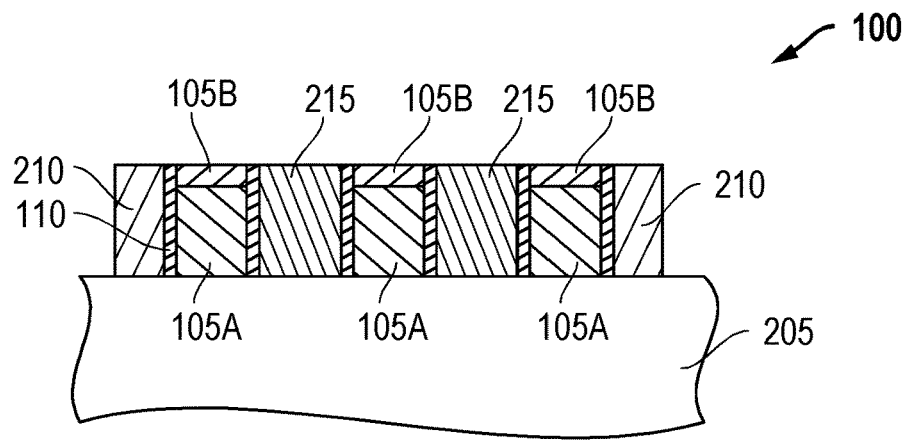
Figure 2E:
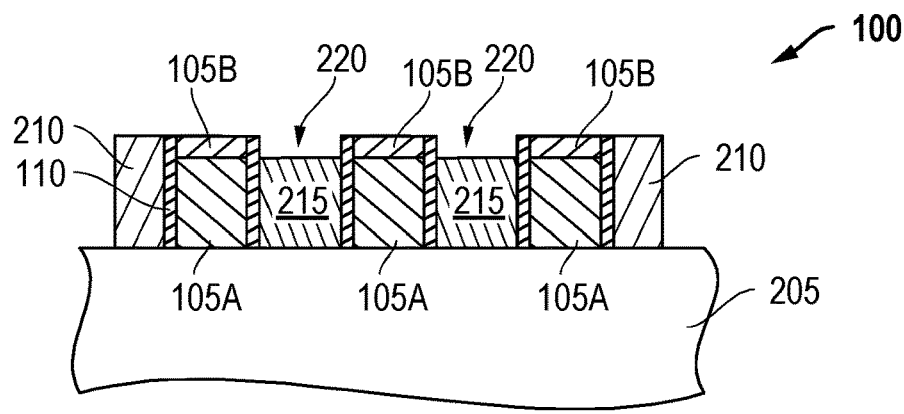

Excess trench conductors 215 material is removed by a planarization process (e.g., CMP) in FIG. 2D or by other methods. The trench conductors 215 may then be further recessed by an etch process in FIG. 2E. The trench conductors 215 material (e.g., W) may be etched using any of a variety of known etch process to form the trench conductor recesses 220 shown in FIG. 2E. In one embodiment, the etch process used to etch the trench conductor recesses 220 may be a wet etch or a dry etch. In one example a dry chlorine based chemistry may be utilized.

Figure 2F:
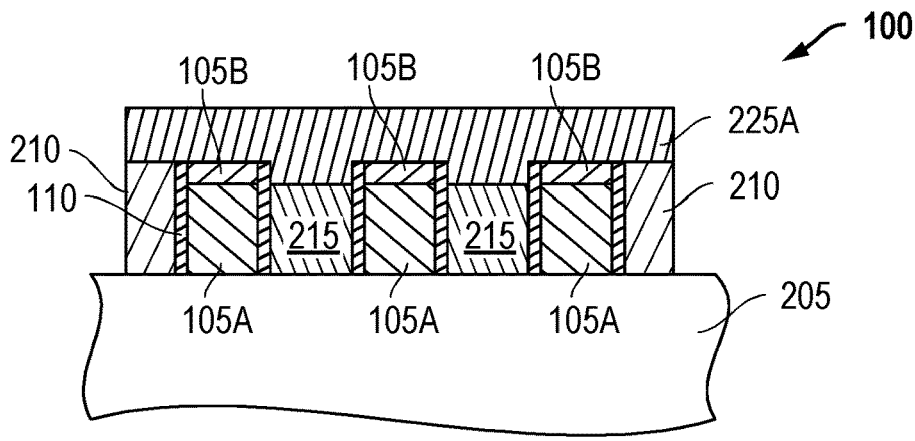

In FIG. 2F, a spin-on SiC layer 225A is formed on the semiconductor structure 100. As known in the art, a coating material may be "spun-on" to a substrate or surface to form a uniform spin-on layer (or film). Spin coating a material enhances its uniformity in coverage and planarization, and is a procedure commonly used to deposit uniform thin layers to substrates. Usually, a small amount of coating material is applied to the center of the substrate, which is either spinning at low speed or not spinning at all. The substrate is then rotated at high speed in order to spread the coating material by centrifugal force. Rotation is continued, while the fluid spins off the edges of the substrate, until the desired thickness of the layer is achieved. A solvent may be included in the coating material that is usually volatile, and simultaneously evaporates during the spinning process. Typically, the higher the angular speed of spinning, the thinner the layer. The thickness of the layer also depends on material properties of the coating material, such as the viscosity and concentration of the solution and the solvent.

In addition to the ability to form thin layers, spin-on coatings are known for their ability to fill in gaps. Using a spin-on process to form spin-on SiC layer 225A ensures that the silicon carbide material completely fills in the trench conductor recesses 220 and other topography (not shown) on the substrate, thereby avoiding void formation within the recesses. The techniques described herein may be utilized with a wide variety of materials that are spun-on a substrate so as to form the spin-on silicon carbide layer. The materials utilized may include, but are not limited to methyl silsesquioxane (MSQ) or polycarbosilane (PCS).

Figure 2G:
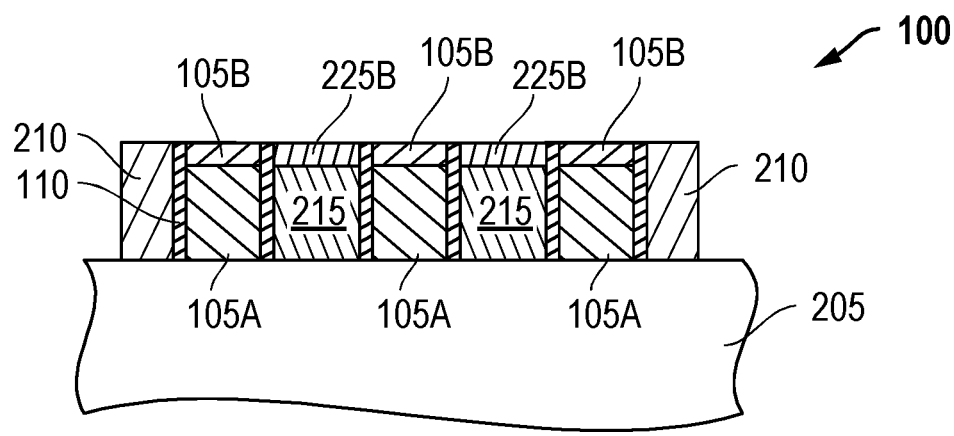

After the spin-on SiC layer 225A is formed on the semiconductor structure 100, as shown in FIG. 2F, a planarization process (e.g., CMP) may be used to remove excess portions of the spin-on SiC layer 225A to thereby form dielectric cap layers (i.e., trench caps 225B) on the trench conductors 215, as shown in FIG. 2G. Other planarization processes may be utilized as the techniques described herein are not limited to a particular planarization process. However, with regard to CMP, since the spin-on SiC layer 225A is more suitable for CMP planarization (for example as compared to CVD formed SiC layers), fewer defects occur when planarizing the spin-on SiC layer 225A than when planarizing CVD SiC.

Figure 2H:
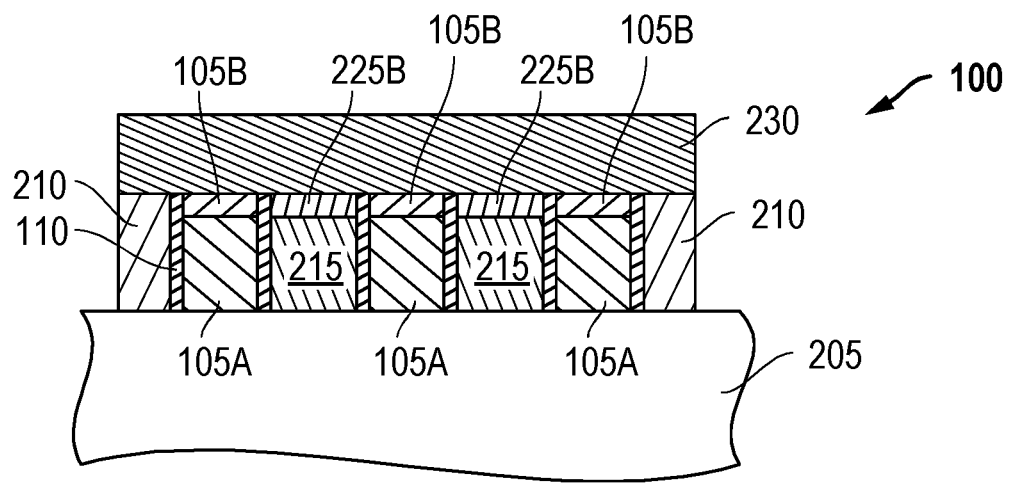

After the trench caps 225B are formed, a second dielectric layer 230 may be deposited onto the semiconductor structure 100, as shown in FIG. 2H. The second dielectric layer 230 is an interlayer dielectric (ILD) film, which is used to electrically isolate the conductive regions (e.g., the gate conductors 105A and trench conductors 215) of the semiconductor structure 100 from other upper conductor layers subsequently formed. The second dielectric layer 230 may be an oxide, such as for example, silicon dioxide ($SiO_2$), carbon doped silicon oxide or fluorine doped silicon oxide. The second dielectric layer 230 may be deposited using any of a wide variety of known processes.

Figure 3:
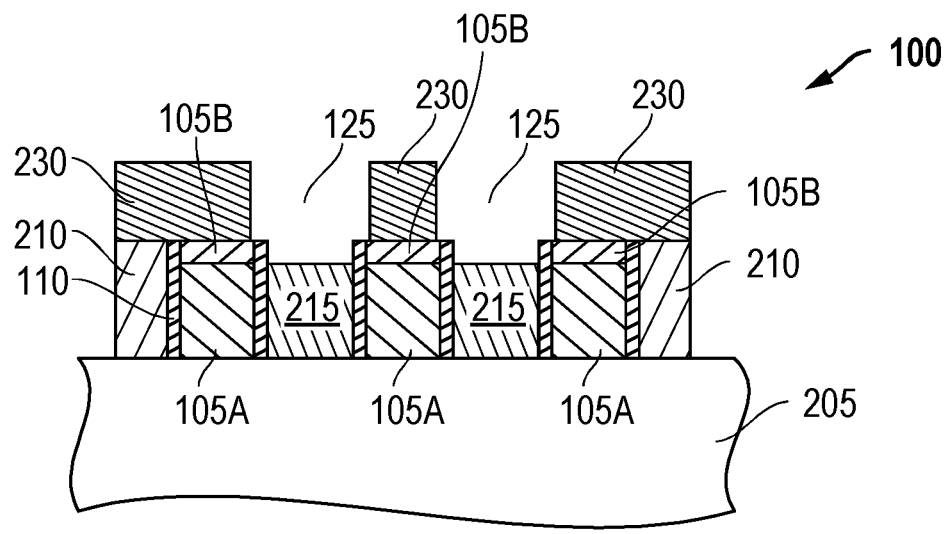
FIG. 3 is a cross-sectional view through line 3-3 of FIG. 1 illustrating one example of self-aligned contacts that may be formed in accordance with the improved process flow shown in FIGS. 2A-2H.
Figure 4:
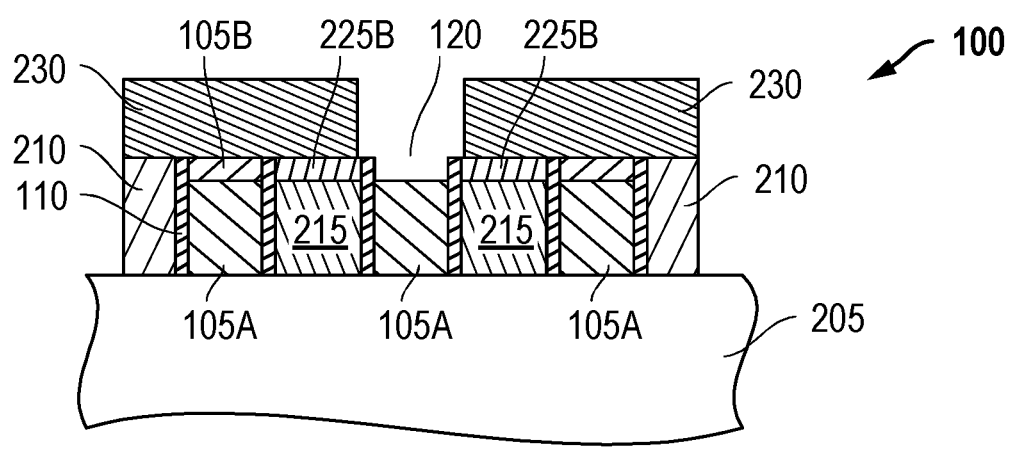
FIG. 4 is a cross-sectional view through line 4-4 of FIG. 1 illustrating another example of a self-aligned contact that may be formed in accordance with the improved process flow shown in FIGS. 2A-2H.

After the second dielectric layer 230 is deposited, one or more etch processes may be performed to etch the second dielectric layer 230 and form self-aligned contacts to the conductive regions (e.g., the gate conductors 105A and trench conductors 215) of the semiconductor structure 100, as shown in FIGS. 3 and 4. FIG. 3 provides a cross-sectional view through lines 3-3 of FIG. 1, illustrating how the second dielectric layer 230 may be etched to form source and drain contacts 125 to the trench conductors 215. The source and drain contacts 125 shown in FIG. 3 are illustrated within the same cross-section or plane of the semiconductor structure 100 for drawing simplicity. As noted above and shown in FIG. 1, the source and drain contacts 125 may be located in two different planes of the semiconductor structure 100, in some embodiments. FIG. 4 provides a cross-sectional view through line 4-4 of FIG. 1, illustrating how the second dielectric layer 230 may be etched to form a gate contact 120 to the gate conductors 105A.

Although not shown in the figures, the gate contact 120 and the source and drain contacts 125 may each be formed by providing a patterning layer above the second dielectric layer 230 and etching portions of the second dielectric layer exposed by the patterning layer to form the gate, source and drain contacts. The patterning layer used to etch the gate contact 120 may be different from the patterning layer used to etch the source and drain contacts 125. For example, a first patterning layer (not shown) may be formed above and used to etch portions of the second dielectric layer 230 exposed by the first patterning layer to form the gate contact 120, and a second patterning layer (not shown) may be formed above and used to etch portions of the second dielectric layer 230 exposed by the second patterning layer to form the source and drain contacts 125. The order of the patterning layers may also be vice-versa. The gate contact 120 and the source and drain contacts 125 may be etched using any of a wide variety of known etch process. In one embodiment, one or more dry etch or plasma etch processes may be used to etch the gate contact 120 and the source and drain contacts 125 using any suitable plasma etch chemistry.

In one preferred embodiment, the plasma etch chemistry used to etch the source and drain contacts 125 may have a higher etch rate of the second dielectric layer 230 and the SiC material used to form the trench caps 225B and a lower etch rate of the SiN material used to form the gate caps 105B. Thus, the etch used to etch the source and drain contacts 125 provides an etch that will selectively etch the SiC trench caps as compared to the SiN gate caps. It will be noted that a common etch step may be used to etch through all of the second dielectric layer and the SiC material in the source and drain contact regions or multiple steps may be utilized (for example the last step being the step that provides a high selectivity between the SiC and SiN materials). In one example, second dielectric layer 230 may be etched using a $C_4F_8/O_2/Ar$ chemistry which stops on the SiC and SiN layers. Then the etch may switch to a chlorine based etch chemistry to etch the SiC In one embodiment, a chlorine-based plasma may be used to etch the source and drain contacts 125. Examples of chlorine-based plasma etch chemistries include, but are not limited to, a chlorine-oxygen (Cl$_2$/O$_2$) plasma etch chemistry. In this manner, the source and drain contacts may be etched while the etch utilized does not negatively impact the cap protection provided over the gates.

In one preferred embodiment, the plasma etch chemistry used to etch the gate contact 120 may have a higher etch rate of the second dielectric layer 230 and the SiN material used to form the gate caps 105B, and a lower etch rate of the SiC material used to form the trench caps 225B. In one embodiment, a fluoromethane (CH$_3$F) based plasma may be used to etch the gate contact 120. Other fluorocarbons may be utilized such as CF$_4$, CHF$_3$, CH$_2$F$_2$, etc. Examples of fluoromethane based plasma etch chemistries include, but are not limited to, a fluoromethane-hydrogen-argon (CH$_3$F/H$_2$/Ar) plasma etch chemistry. Similar to as described above with regard to the source and drain contact etching, the gate contact etching may be performed using one common chemistry to etch both the second dielectric layer and the SiN material in the source and drain contact regions or multiple steps may be utilized (for example the last step being the step that provides a high selectivity between the SiN and SiC materials). In this manner, the gate contacts may be etched while the etch utilized does not negatively impact the cap protection provided over the trench conductor of the source and drain region.

A table 500 is provided in FIG. 5 to compare the etch rate and etch selectivity between different spin-on silicon carbide (SiC) films, which may be used to form the trench caps 225, and an example silicon nitride (SiN) film used to form the gate caps 105B. In the illustrated table, the etch rate (expressed in nm/min) and the etch selectivity (SiC/SiN) of three different spin-on silicon carbide (SiC) films are compared against the etch rate (expressed in nm/min) and the etch selectivity (SiN/SiC) of the example silicon nitride (SiN) film for a chlorine based etch and a fluoromethane based etch.

To generate the results shown in FIG. 5, three different spin-on silicon carbide films (SiC_1, SiC_2 and SiC_3) were selected for study. The silicon carbide films shown in the table include materials having differing silicon to carbon ratios obtained from various process condition changes to temperature, time, nitrogen versus air versus oxidant level, etc. As noted above and illustrated in the table, a chlorine-based plasma etch chemistry (e.g., Cl$_2$/O$_2$) was used to etch the SiC trench caps 225B and form the source and drain contacts 125, and a fluoromethane based plasma etch chemistry (e.g., CH$_3$F/H$_2$/Ar) was used to etch the SiN gate caps 105B and form the gate contact 120.

As shown in the illustrated table, when etching SiC_3 with a chlorine-based plasma etch chemistry (e.g., Cl$_2$/O$_2$), the SiC_3 film demonstrates a very fast etch rate (374.3 nm/min) and ultrahigh etch selectivity (120:1) to the SiN gate caps 105B. The high selectivity between SiC_3 and SiN ensures that the SiN gate caps 105B will provide cap protection for the underlying gate conductors 105A, thus allowing the self-aligned formation of the source and drain contacts. When etching SiN using a fluoromethane based plasma etch chemistry (e.g., CH$_3$F/H$_2$/Ar), the SiN film has a higher etch rate of 15.9 nm/min and SiC_3 has a lower etch rate of 1.8 nm/min. Thus, a high etch selectivity (8.8:1) is provided between the SiC_3 and SiN. Thus, the SiC trench caps 225B provide cap protection to the underlying trench conductors allowing the self-aligned formation of the gate contacts.

Table 500 of FIG. 4 also shows the etch rates when utilizing films SiC_1 and SiC_2. As noted from the table, both films similarly demonstrate higher etch rates (as compared to SiN) for the chlorine based etch and lower etch rates (as compared to SiN) for the fluoromethane based etch. Thus, SiC_1 and SiC_2 also provide the desired selectivities for use in the source and drain contact etch step and the gate contact etch step.

Figure 6:
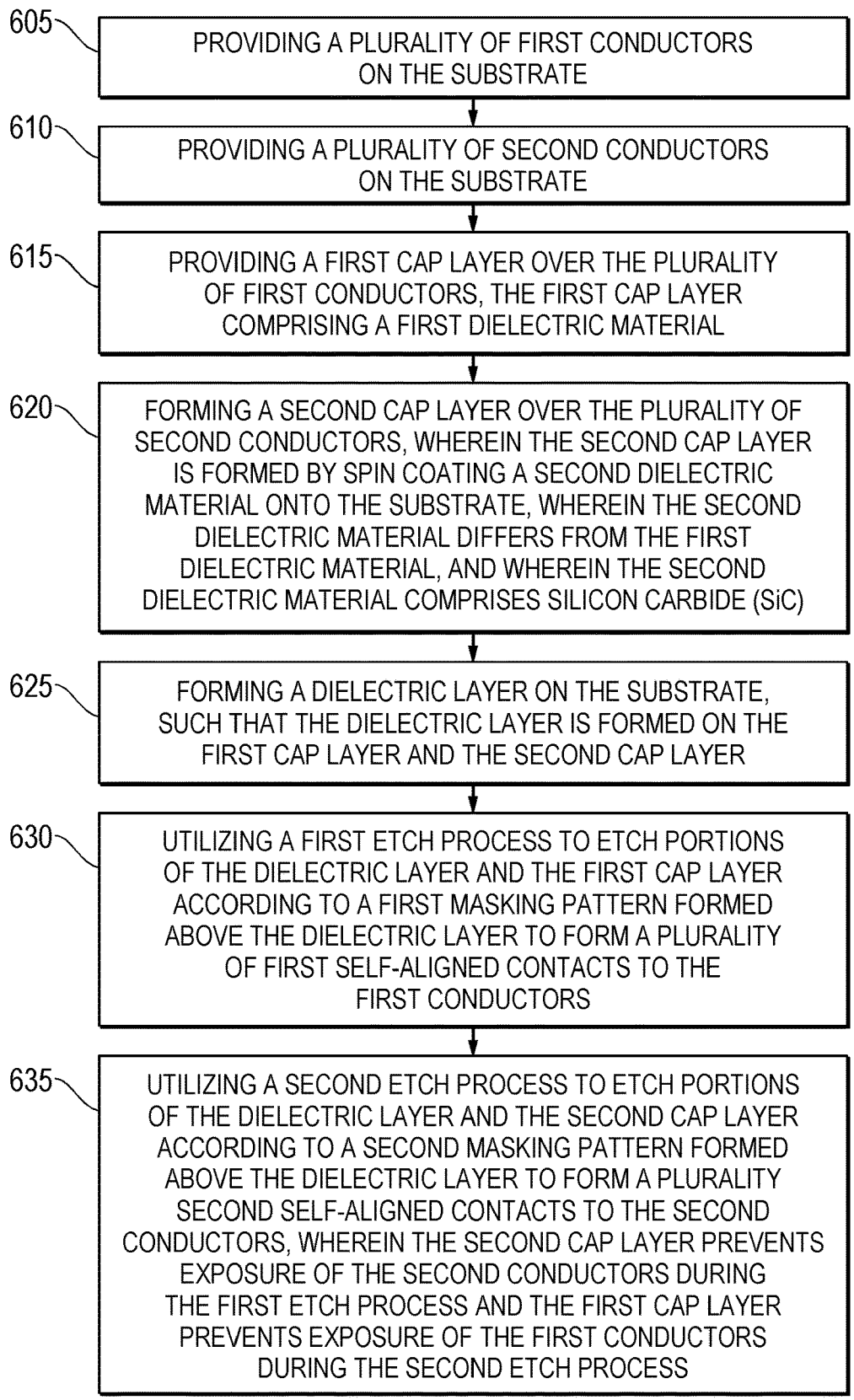
FIG. 6 is a flowchart diagram illustrating one embodiment of a method to form self-aligned contacts within a semiconductor structure.
Figure 7:
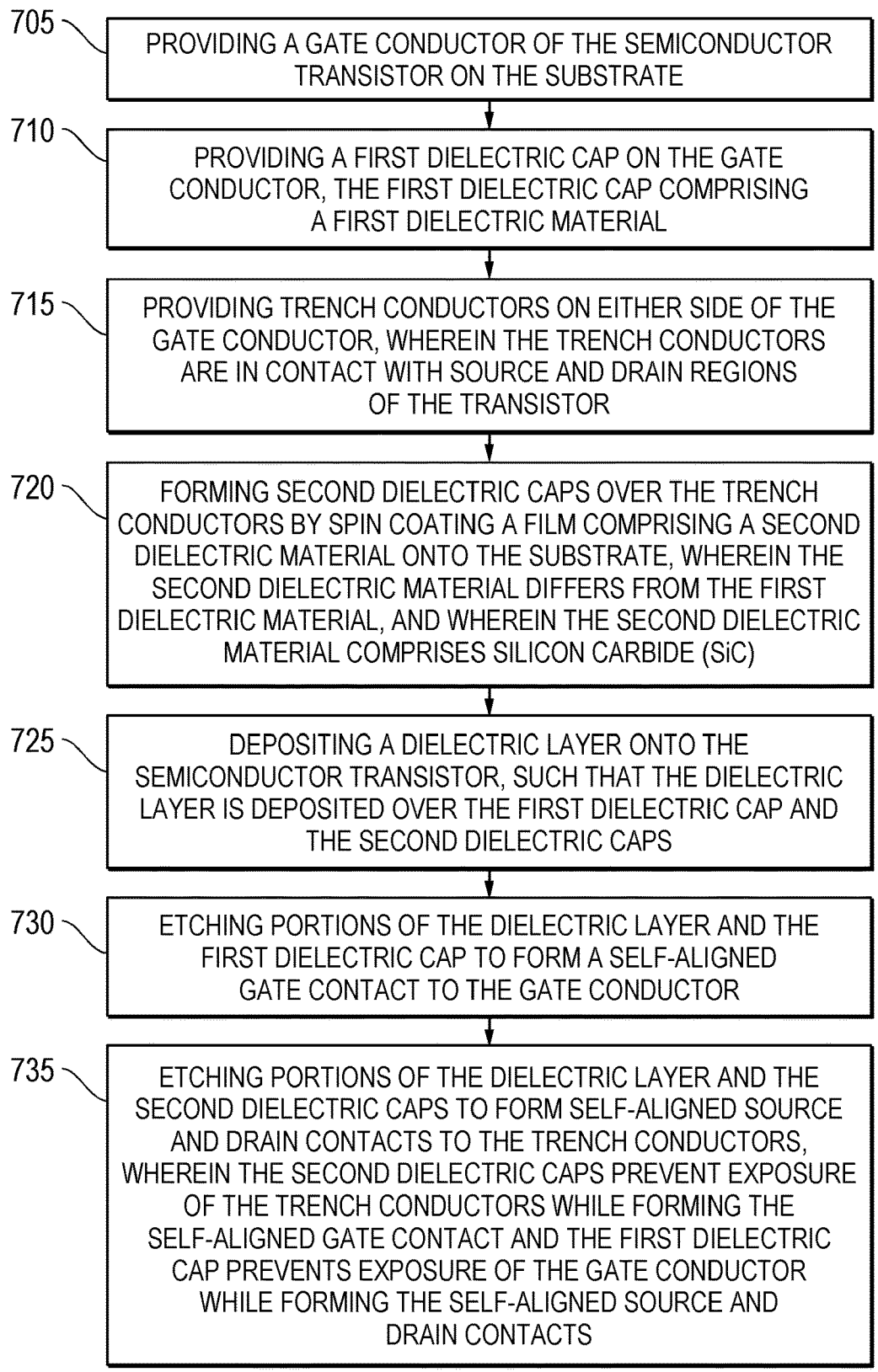
FIG. 7 is a flowchart diagram illustrating one embodiment of a method to form self-aligned contacts to conductors of a semiconductor transistor.

FIGS. 6 and 7 illustrate embodiments of exemplary methods that utilize the techniques described herein. It will be recognized that the embodiments shown in FIGS. 6 and 7 is merely exemplary and additional methods may utilize the techniques described herein. Further, additional processing steps may be added to the methods shown in FIGS. 6 and 7 as the steps described are not intended to be exclusive. Moreover, the order of the steps is not limited to the order shown in the figures as different orders may occur and/or various steps may be performed in combination or at the same time.

FIG. 6 illustrates one embodiment of a method to form self-aligned contacts within on a substrate. The method includes step 605 of providing a plurality of first conductors on the substrate, step 610 of providing a plurality of second conductors on the substrate, and step 615 of providing a first cap layer over the plurality of first conductors, the first cap layer comprising a first dielectric material. The method further includes step 620 of forming a second cap layer over the plurality of second conductors, wherein the second cap layer is formed by spin coating a second dielectric material onto the substrate, wherein the second dielectric material differs from the first dielectric material, and wherein the second dielectric material comprises silicon carbide (SiC). The method also includes step 625 of forming a dielectric layer on the substrate, such that the dielectric layer is formed on the first cap layer and the second cap layer. The method further includes step 630 of utilizing a first etch process to etch portions of the dielectric layer and the first cap layer according to a first masking pattern formed above the dielectric layer to form a plurality of first self-aligned contacts to the first conductors. Additionally the method has step 635 of utilizing a second etch process to etch portions of the dielectric layer and the second cap layer according to a second masking pattern formed above the dielectric layer to form a plurality second self-aligned contacts to the second conductors, wherein the second cap layer prevents exposure of the second conductors during the first etch process and the first cap layer prevents exposure of the first conductors during the second etch process.

FIG. 7 illustrates one embodiment of a method to form self-aligned contacts to conductors of a semiconductor transistor. In the illustrated embodiment, method 400 is used to form self-aligned contacts (e.g., self-aligned gate, source and drain contacts) for a semiconductor transistor (e.g., a metal-oxide-semiconductor field-effect transistor, or MOSFET). However, one skilled in the art would recognize how similar method steps may be used to form self-aligned contacts for other types of transistors and other types of semiconductor structures. As shown In FIG. 7, the method includes step 705 of providing a gate conductor of the semiconductor transistor on the substrate, step 710 of providing a first dielectric cap on the gate conductor, the first dielectric cap comprising a first dielectric material, and step 715 of providing trench conductors on either side of the gate conductor, wherein the of trench conductors are in contact with source and drain regions of the transistor. The method further comprises step 720 of forming second dielectric caps over the trench conductors by spin coating a film comprising a second dielectric material onto the substrate, wherein the second dielectric material differs from the first dielectric material, and wherein the second dielectric material comprises silicon carbide (SiC). The method also includes step 725 of depositing a dielectric layer onto the semiconductor transistor, such that the dielectric layer is deposited over the first dielectric cap and the second dielectric cap. The method also includes step 630 of etching portions of the dielectric layer and the first dielectric cap to form a self-aligned gate contact to the gate conductor. The method further includes step 635 of etching portions of the dielectric layer and the second dielectric caps to form self-aligned source and drain contacts to the trench conductors, wherein the second dielectric caps prevent exposure of the trench conductors while forming the self-aligned gate contact and the first dielectric cap prevents exposure of the gate conductor while forming the self-aligned source and drain contacts.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Systems and methods for processing a substrate are described in various embodiments. The substrate may include any material portion or structure of a device, particularly a semiconductor or other electronics device, and may, for example, be a base substrate structure, such as a semiconductor substrate or a layer on or overlying a base substrate structure such as a thin film. Thus, substrate is not intended to be limited to any particular base structure, underlying layer or overlying layer, patterned or unpatterned, but rather, is contemplated to include any such layer or base structure, and any combination of layers and/or base structures.

One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A method to form self-aligned contacts on a substrate, the method comprising:
    providing a plurality of first conductors on the substrate;
    providing a plurality of second conductors on the substrate;
    providing a first cap layer over the plurality of first conductors, the first cap layer comprising a first dielectric material;
    forming a second cap layer over the plurality of second conductors, wherein the second cap layer is formed by spin coating a second dielectric material onto the substrate, wherein the second dielectric material differs from the first dielectric material, and wherein the second dielectric material comprises silicon carbide (SiC);
    forming a dielectric layer on the substrate, such that the dielectric layer is formed on the first cap layer and the second cap layer;
    utilizing a first etch process to etch portions of the dielectric layer and the first cap layer according to a first masking pattern formed above the dielectric layer to form a plurality of first self-aligned contacts to the first conductors; and
    utilizing a second etch process to etch portions of the dielectric layer and the second cap layer according to a second masking pattern formed above the dielectric layer to form a plurality second self-aligned contacts to the second conductors,
    wherein the second cap layer prevents exposure of the second conductors during the first etch process and the first cap layer prevents exposure of the first conductors during the second etch process.

2. The method of claim 1, wherein the first dielectric material comprises silicon nitride (SiN).

3. The method of claim 1, wherein after the second cap layer is formed, the method further comprises planarizing the second cap layer to remove excess portions of the second cap layer and form a plurality of second dielectric caps on the plurality of second conductors.

4. The method of claim 1, further comprising providing recesses above the plurality of second conductors, wherein the spin coating of the second dielectric material onto substrate fills the recesses with the second dielectric material.

5. The method of claim 4, wherein after the second cap layer is formed, the method further comprises planarizing the second cap layer to remove excess portions of the second cap layer and form a plurality of second dielectric caps on the plurality of second conductors.

6. The method of claim 4, wherein the method prevents void formation in the plurality of second dielectric caps by spinning the second dielectric material onto the substrate.

7. The method of claim 4, wherein by spinning the second dielectric material onto the substrate, the method reduces or eliminates defects that occur in the plurality of second dielectric caps that occur when planarizing the second cap layer.

8. The method of claim 1, wherein the first etch process has a higher etch rate of the first dielectric material than of the silicon carbide and the second etch process has a higher etch rate of the silicon carbide than of the first dielectric material.

9. A method for processing a substrate to form self-aligned contacts to conductors of a semiconductor transistor, the method comprising:
providing a gate conductor of the semiconductor transistor on the substrate;
providing a first dielectric cap on the gate conductor, the first dielectric cap comprising a first dielectric material;
providing trench conductors on either side of the gate conductor, wherein the trench conductors are in contact with source and drain regions of the transistor;
forming second dielectric caps over the trench conductors by spin coating a film comprising a second dielectric material onto the substrate, wherein the second dielectric material differs from the first dielectric material, and wherein the second dielectric material comprises silicon carbide (SiC);
depositing a dielectric layer onto the semiconductor transistor, such that the dielectric layer is deposited over the first dielectric cap and the second dielectric caps;
etching portions of the dielectric layer and the first dielectric cap to form a self-aligned gate contact to the gate conductor; and
etching portions of the dielectric layer and the second dielectric caps to form self-aligned source and drain contacts to the trench conductors,
wherein the second dielectric caps prevent exposure of the trench conductors while forming the self-aligned gate contact and the first dielectric cap prevents exposure of the gate conductor while forming the self-aligned source and drain contacts.

10. The method of claim 9, further comprising providing recesses above the trench conductors, wherein the spin coating of the film comprising the second dielectric material onto the substrate fills the recesses with the film.

11. The method of claim 10, wherein after spin coating of the film, the method further comprises planarizing the film to remove excess portions of the film to leave the second dielectric caps over the trench conductors.

12. The method of claim 11, wherein a first etch process utilized to etch the self-aligned gate contact has a higher etch rate of the first dielectric material than of the silicon carbide and a second etch process utilized to etch the self-aligned source and drain contacts has a higher etch rate of the silicon carbide than of the first dielectric material.

13. The method of claim 10, wherein a first etch process utilized to etch the self-aligned gate contact has a higher etch rate of the first dielectric material than of the silicon carbide and a second etch process utilized to etch the self-aligned source and drain contacts has a higher etch rate of the silicon carbide than of the first dielectric material.

14. The method of claim 13, wherein the second etch process comprises a chlorine-based plasma etch chemistry.

15. The method of claim 14, wherein the second etch process comprises a chlorine-oxygen ($Cl_2/O_2$) plasma etch chemistry.

16. The method of claim 14, wherein the first etch process comprises fluoromethane based plasma etch chemistry.

17. The method of claim 13, wherein the first etch process comprises fluoromethane based plasma etch chemistry.

18. The method of claim 17, wherein the first etch process comprises a fluoromethane-hydrogen-argon ($CH_3F/H_2/Ar$) plasma etch chemistry.

19. The method of claim 10, wherein the first dielectric material comprises silicon nitride, and wherein the etching portions of the dielectric layer and the first dielectric cap to form the self-aligned gate contact to the gate conductor comprises utilizing a fluoromethane based plasma etch chemistry.

20. The method of claim 19, wherein a first etch process utilized to etch the self-aligned gate contact has a higher etch rate of the silicon nitride than of the silicon carbide and second etch process utilized to etch the self-aligned source and drain contacts has a higher etch rate of the silicon carbide than of the silicon nitride.

* * * * *